(12) United States Patent
Forrer et al.

(10) Patent No.: US 6,661,447 B2
(45) Date of Patent: Dec. 9, 2003

(54) IMAGE-RECORDING DEVICE FOR A PRINTING FORM HAVING MACROOPTICS OF THE OFFNER TYPE

(75) Inventors: Martin Forrer, Gallen (CH); Hans-Joerg Heimbeck, Heerbrugg (CH); Eckhard Langenbach, Speicherschwendi (CH); Bernd Vosseler, Heidelberg (DE); Bernard Beier, Ladenburg (DE)

(73) Assignee: Heidelberger Druckmaschinen AG, Heidelberg (DE)

(*) Notice: Subject to any disclaimer, the term of this patent is extended or adjusted under 35 U.S.C. 154(b) by 26 days.

(21) Appl. No.: 10/107,567

(22) Filed: Mar. 27, 2002

(65) Prior Publication Data

US 2003/0007066 A1 Jan. 9, 2003

(30) Foreign Application Priority Data

Mar. 30, 2001 (DE) .......................... 101 15 875

(51) Int. Cl.⁷ .............................. B41J 2/45; B41J 2/475; G03F 7/20; G02B 27/18
(52) U.S. Cl. ...................................... 347/241
(58) Field of Search ................. 347/233, 241, 347/256; 359/366, 727, 731; 355/18, 43, 51, 66

(56) References Cited

U.S. PATENT DOCUMENTS

| 3,748,015 A | 7/1973 | Offner | 350/55 |
|---|---|---|---|
| 4,428,647 A | 1/1984 | Sprague et al. | 350/167 |
| 4,749,840 A | 6/1988 | Piwczyk | 219/121 |
| 4,933,714 A | 6/1990 | Buckley et al. | 355/43 |
| 5,581,605 A | 12/1996 | Murakami et al. | 378/84 |
| 5,592,444 A | 1/1997 | Alon et al. | 369/13 |
| 5,598,393 A | 1/1997 | Alon et al. | 369/102 |
| 5,704,700 A | 1/1998 | Kappel et al. | 353/31 |
| 5,729,331 A * | 3/1998 | Tanaka et al. | |
| 6,104,511 A | 8/2000 | Hesselink et al. | 359/22 |

FOREIGN PATENT DOCUMENTS

| EP | 0569718 | 11/1993 |
| EP | 0630002 | 12/1994 |
| EP | 0694408 | 1/1996 |
| GB | 2332533 | 6/1999 |

* cited by examiner

Primary Examiner—Huan Tran
(74) Attorney, Agent, or Firm—Davidson, Davidson & Kappel, LLC

(57) ABSTRACT

An image-recording device for a printing form (29), including an array of light sources (12) and a downstream microoptics (14), which generates a virtual intermediate image (18) of the light sources (12), which is distinguished by the microoptics (14) having a downstream optical system (10) of a convex mirror (26) and of a concave mirror (24) having a common center of curvature, a combination of the Offner type, which produces a real image (28) of the virtual intermediate images (18). By employing a monolithic structure (40) of the optical system (10) of a convex mirror (26) and of a concave mirror (24), a more compact, space-saving design is able to achieved. The image-recording device according to the present invention may be utilized to special advantage for a printing form (29) in a plate-exposure unit or in a print unit of a printing press.

13 Claims, 7 Drawing Sheets

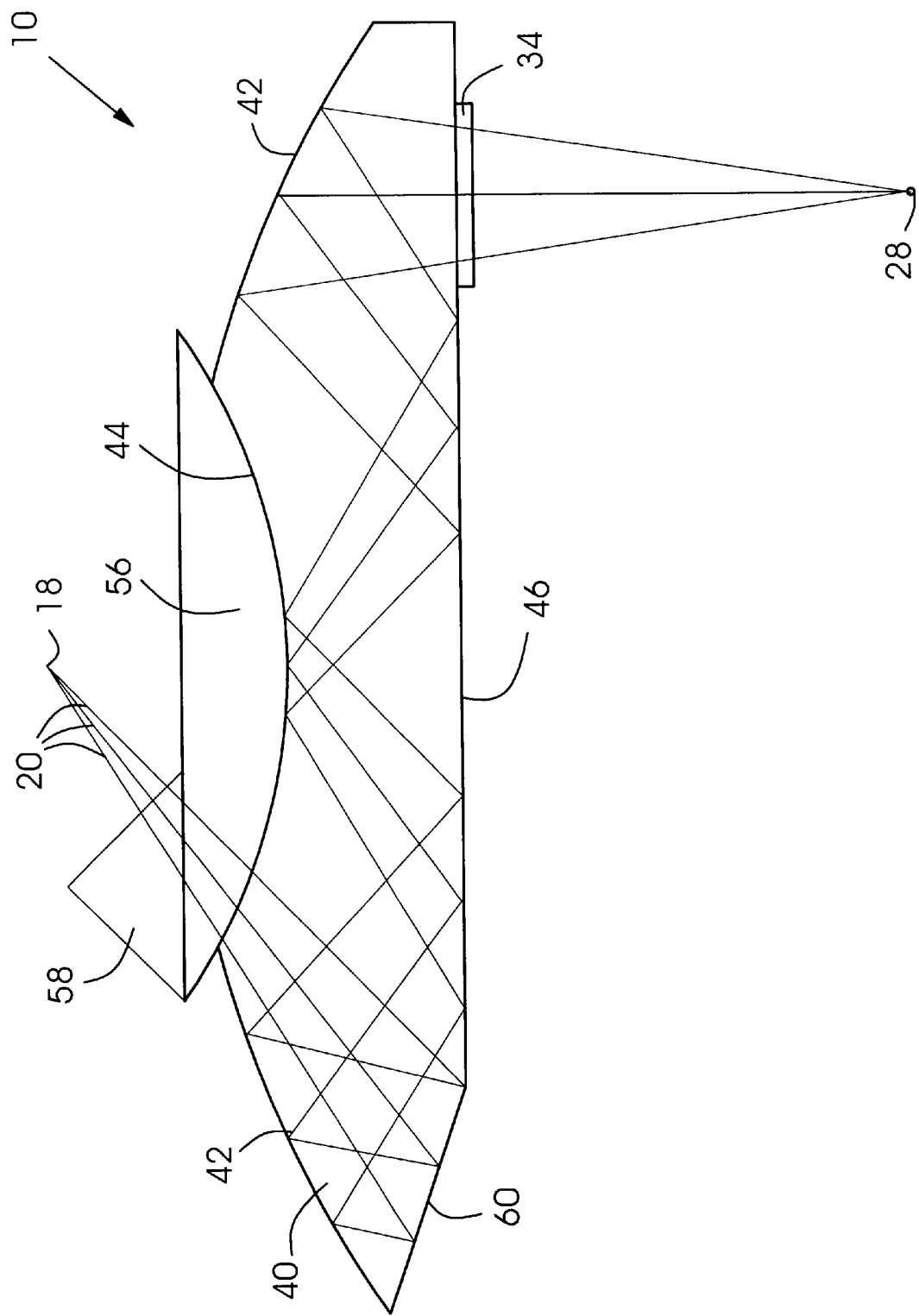

IMAGE-RECORDING DEVICE FOR A PRINTING FORM HAVING MACROOPTICS OF THE OFFNER TYPE

Priority to German Patent Application No. 101 15 875.0, filed Mar. 30, 2001 and hereby incorporated by reference herein, is claimed.

BACKGROUND INFORMATION

The present invention is directed to an image-recording device for a printing form, including an array of light sources and a downstream microoptics which generates a virtual image of the light sources.

The use of light source arrays in rows or in matrix form for recording images on printing forms, whether in a printing-form exposure unit or in a direct-imaging print unit, places high demands on the imaging optics to be used. Typically, the light source arrays are made up of a specific number of diode lasers, preferably of single-mode lasers, which are mounted at a defined distance from one another, usually spaced apart at substantially the same intervals on a semiconductor substrate, and which share a common exit plane that is precisely defined over the crystallographic plane of fracture. The light-emission cones of these light sources or diode lasers open at different widths in the two planes of symmetry which are substantially orthogonal to one another. From this, the necessity arises of an imaging optics which, on the one hand, reduces, preferably minimizes this asymmetry by using a preferably small number of subassemblies, and, on the other hand, renders possible a global imaging of the array of emitters that is as free of aberrations as possible.

From the related art, one knows of a number of optical imaging systems, which are specially implemented for imaging diode laser arrays to form images on a light-sensitive medium. For example, from U.S. Pat. No. 4,428,647, a semiconductor laser array is known, each of whose individual lasers is assigned an adjacent lens between the laser array and the objective lens. The purpose of these lenses is to change the angle of divergence of the light beams emerging from the surface of the laser array, such that the light is collected as efficiently as possible by the objective lenses and is focused at a light sensitive medium. The optical power of these lenses is selected such that, for each laser, a virtual intermediate image is formed behind the emitting surface, whose spacings correspond approximately to the spacings of the emitted light beams, the emitter's intermediate image being magnified.

EP 0 694 408 B 1 describes, for example, how a microoptics is able to reduce the divergence of the emerging light by using axially symmetric optical elements.

The often exceptionally large difference in the lateral field dimensions of a light source array of this kind, for example 10×0.001 mm², therefore requires a specific microscopic and macroscopic image formation. A use of spherical optics for these dimensions can only succeed by employing a relatively large and costly optical design. A disadvantage encountered when using a spherical macrooptics is the variable image quality as a function of the distance to the optical axis. Even the use of cylinder lenses and cylinder lens arrays has, to date, not produced the consistent quality desired for an imaging of a light source array, particularly in the form of a diode laser array.

From U.S. Pat. No. 3,748,015, one knows of an optical system for forming an image of an object with unit magnification and high resolution, which includes an arrangement of a convex and concave spherical mirror, whose centers of curvature coincide at one point. This mirror arrangement produces at least three reflection points within the system and two conjugate regions set apart from the optical axis, at unit magnification in a plane which contains the center of curvature, the optical axis of the system being orthogonal to this plane in the center of curvature. Such a combination of mirrors is free of spherical aberration, coma and distortion, and, when the algebraic sum of the powers or refractive powers of the mirror reflecting surfaces utilized is zero, the image produced is free from third order astigmatism and field curvature. An optical system of this kind is referred to as an optical system of the Offner type.

U.S. Pat. No. 5,592,444, for example, describes a method and a corresponding device for writing and reading data to an optical storage medium, simultaneously in a plurality of tracks. The imaging optics described in this document for a plurality of individually controllable diode lasers includes, in this context, a system of spherical mirrors of the above-described Offner type, thus a combination of spherical concave and convex mirrors having a common center of curvature. However, no virtual, in particular no magnified intermediate image is produced by the divergence-reducing micro optics.

However, the use of an image-recording device for a printing form in a printing-form exposure unit or in a print unit in a printing press requires additional measures. Since, on the one hand, machines of this kind have a very limited assembly space, and, on the other hand, little can be altered on the design or on the configuration of the printing-form exposure unit or on the print unit to implement an image-recording device, it is necessary to reduce the required assembly space. In addition, an imaging optics on a printing press or a printing-form exposure unit is subject to shocks or vibrations, so that it should have as few parts as possible that require relative adjustment. For that reason, known related-art optical systems cannot simply be transferred for use on a printing-form exposure unit or within a print unit of a printing press.

SUMMARY OF THE INVENTION

An object of the present invention is, therefore, to devise an imaging optics for an array of light sources, which will reduce the divergence of the emitted light in simple fashion and render possible an image formation having few aberrations. It is additionally or alternatively intended to realize an imaging optics for an image-recording device for a printing form which will require the least possible amount of overall space and as few as possible parts, and therefore, as few as possible degrees of freedom in the adjustment.

The present invention provides an image-recording device for a printing form (29), including an array of light sources (12) and a downstream microoptics (14) which generates a virtual intermediate image (18) of the light sources (12). Arranged downstream from the microoptics is an optical system (10), which includes at least one sector of a convex mirror (26) and one sector of a concave mirror (24) having a common center of curvature, which produces a real image (28).

The image-recording device according to the present invention for a printing form, having an array of light sources and a downstream microoptics which produces a virtual image of the light sources, is distinguished by the microoptics having the downstream optical system, which includes at least one concave mirror sector and one convex mirror sector having a common center of curvature, the algebraic sum of the powers of the refractive powers preferably being zero, in other words, a macrooptics or combination of the Offner type, which produces a real image of the virtual intermediate image. In the following, a convex and concave mirror arrangement is also discussed in simplified terms, although, here as well, at least one mirror may only have one sector that defines a surface that is simply as well as non-simply cohesive, in a specific subspace angular range of maximally 4π. In this context, one specific embodiment provides, in reality, that the centers of curvature of the concave mirror and of the convex mirror need not coincide with complete precision in order to obtain the desired properties of the Offner-type optical system, exactly enough, for use in an image-recording device according to the present invention.

Using a small number of optically refractive surfaces, in the image-recording device of the present invention, each light source of the array is adapted via a virtual intermediate image to the microscopic requirements, thus, in particular, to the divergence. A downstream macroscopic imaging, utilizing known properties of an Offner-type optical system, thus a combination of at least one convex mirror sector and one concave mirror sector having a common center of curvature, enables points to be advantageously imaged along a line that essentially runs in a circle. The optical system, which, as macrooptics, is positioned downstream from the microoptics, of the image-recording device of the present invention is designed such that the virtual intermediate image points of the light sources, which are essentially arranged in one row, are spaced at a smaller distance to this circular line. In other words: the image-recording device of the present invention makes it possible for the emission from a multiplicity of light sources, in particular from diode lasers, to be constantly corrected using a small number of optical elements. By combining cylindrical lenses, one achieves a micro-optical symmetrization, simultaneously accompanied by magnification, using a virtual intermediate image of each light source and a, to the greatest degree, aberration-free imaging of these virtual intermediate images into a real image, by way of a downstream optical system of a convex mirror and a concave mirror, to create an image-recording device for a printing form having especially beneficial image-forming properties.

To facilitate adaptation of the divergence of the emitted light, the microoptics preferably has an aspherical design. These may be, for example, cylindrical lenses or a combination of anamorphotic prisms. The downstream, macroscopic, optical system of a convex and a concave mirror has at least one circular segment of rotationally symmetric optics, to whose assigned object circle, the essentially straight-line projection of the row of virtual, intermediate image points exhibits a spacing that is kept small, the object circle being situated within one of the two conjugate regions of the optical system of a convex and concave mirror. Thus, using the optical system of the Offner type, the essentially straight-line row of virtual, intermediate image points may be produced as real images, with unit magnification, in the second conjugate region. Especially advantageous in this context is the absence of aberration in the optical system of a convex and a concave mirror.

To reduce the overall space required for the image-recording device of the present invention, the optical path is advantageously folded at least once within the optical system of one convex and one concave mirror. Therefore, at least one path-folding surface is beneficially provided in the optical system situated downstream from the microoptics, whether it be upstream and/or downstream from the reflective surfaces of the optical system of a convex and a concave mirror. This yields a compact optical path through the imaging optics of the image-recording device of the present invention, so that it is possible to reduce the overall required space for an implementation within a printing-form exposure unit or a print unit. Moreover, at least one part of the optical system of a convex mirror and of a concave mirror may be fashioned quite advantageously as a single component, thus monolithically from a suitable material having a refractive index that differs from the ambient environment, for example from a glass or a another transparent material. The individual component, i.e., the monolith may then have partially internally reflecting surfaces, which, for example, form the concave and convex reflective surfaces, respectively, of the optical system of a convex and a concave mirror. These internal surfaces are also described as the active internal surfaces of the monolith. Provided at the monolith are at least one entrance window and one exit window for the light emitted by at least one light source, the windows preferably having an antireflection coating in the form of an interference filter. In one advantageous further embodiment, other optical elements, such as prisms or path-folding surfaces may be assigned to the monolithic structure for purposes of beam deflection.

An image-recording device according to the present invention may be utilized to special advantage in a printing-form exposure unit or in a print unit. A printing press in accordance with the present invention, which includes one feeder, at least one print unit, and a delivery unit, has the distinguishing feature of having at least one print unit equipped with an image-recording device according to the present invention.

BRIEF DESCRIPTION OF THE DRAWINGS

Other advantages, beneficial specific embodiments, and further refinements of the present invention are presented on the basis of the subsequent figures and descriptions thereof. In detail, the figures show:

FIG. 7 a schematic representation of a monolithically designed, alternative optical system of a convex mirror and a concave mirror, including a convex sphere and a prism for coupling in the light to be imaged.

DETAILED DESCRIPTION

Figure 1:
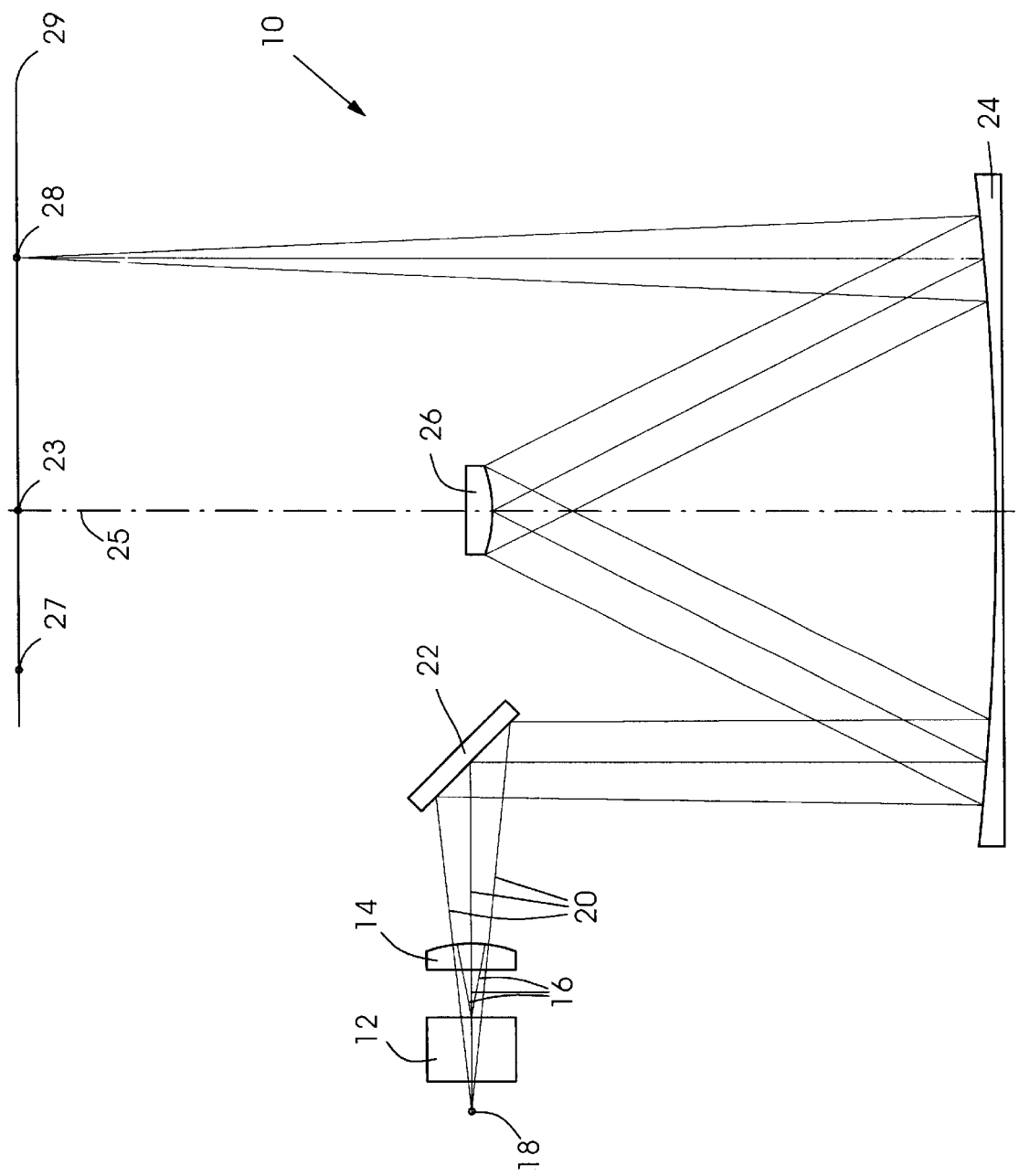
FIG. 1 a schematic representation of a configuration of optical elements in one specific embodiment of the image-recording device according to the present invention for a printing form.

FIG. 1 shows a schematic representation of a configuration of optical elements in one specific embodiment of the image-recording device according to the present invention for a printing form. The image-recording device of the present invention has a light source 12, including an assigned microoptics 14, and a downstream optical system 10. Divergent light 16 emitted by light source 12 is imaged by microoptics 14 onto a virtual image 18. Through downstream optical system 10, light beams 20, emanating from virtual intermediate image 18 via various optical elements, are transformed into a real image point 28. In this specific embodiment, optical system 10 has, first of all, a deflecting element 22 and, configured along optical axis 23 and rotationally symmetric thereto, a pair of mirrors, concave mirror 24 and convex mirror 26, having a common center of curvature 25 along optical axis 23. This pair, made up of concave mirror 24 and convex mirror 26, images points in one object region onto points in an image region. These regions are conjugate to one another. The symmetry of the optical path through optical system 10 is broken by additional deflecting element 22, so that, as a conjugate point, virtual intermediate image 18 is assigned to image point 28, and not conjugate point 27 without a deflecting element in printing form plane 29. The optical path length between virtual intermediate image 18 and concave mirror 24 is, however, equal to the optical length between concave mirror 24 and image point 28 in printing form plane 29.

While in FIG. 1, the imaging of a light source 12 using microoptics 14 and a downstream optical system 10, thus a macrooptics, is graphically shown to facilitate a better understanding of the image-recording device of the present invention, in a corresponding, preferred specific embodiment of the present invention, a plurality of light sources 12, typically arranged in a row, is imaged by a microoptics 14, preferably individually formed for each light source 12, and by a macrooptics acting on the plurality of intermediate images 18, in accordance with optical system 10 of a convex and a concave mirror.

Figure 2:
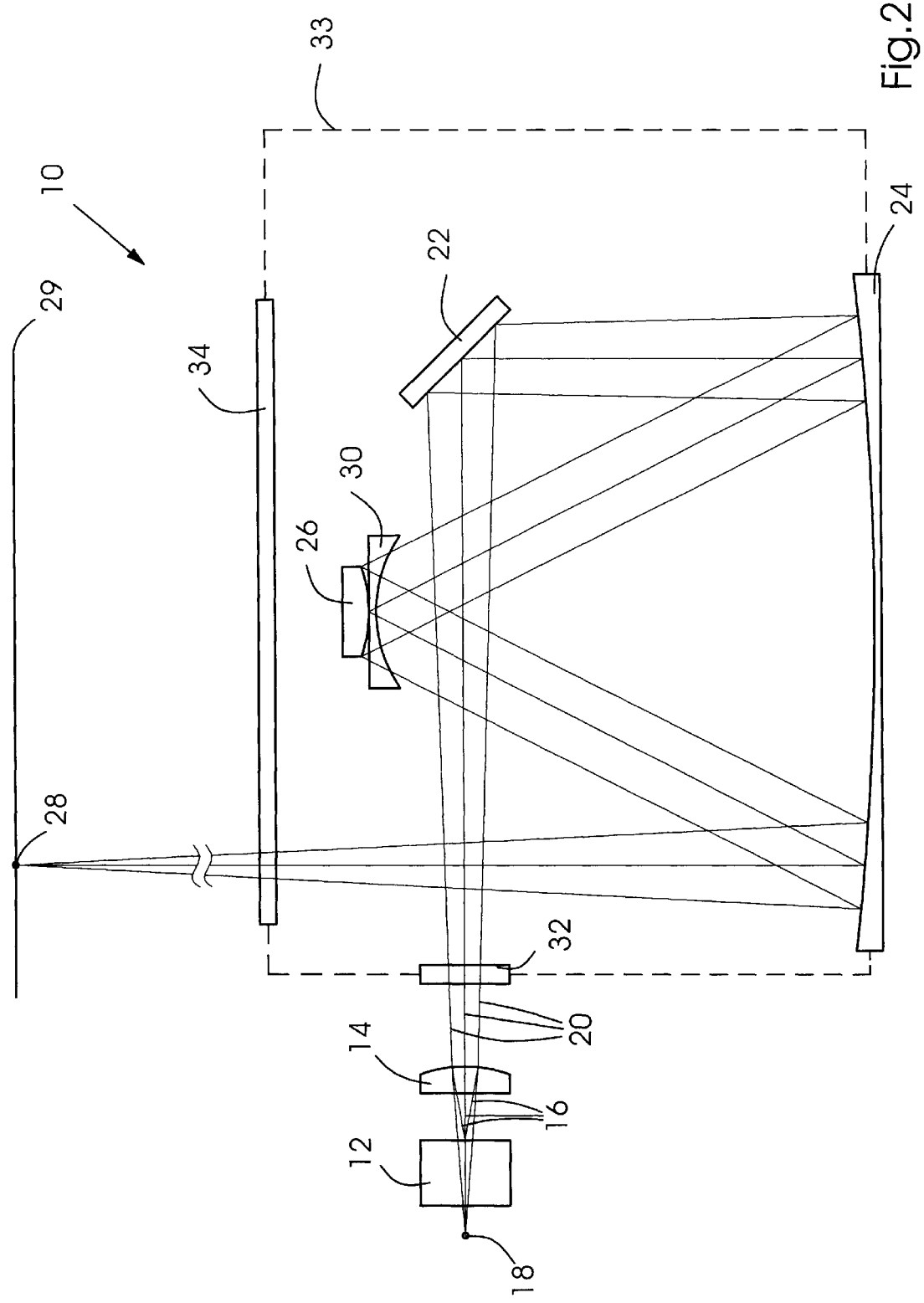
FIG. 2 a schematic representation of a configuration of optical elements in an alternative specific embodiment of the image-recording device according to the present invention, including additional beam-profile filters.

FIG. 2 shows a schematic representation of a configuration of optical elements in an alternative specific embodiment of the image-recording device according to the present invention for a printing form, including an additional beam-profile filter. In this context, the image-recording device of the present invention includes a light source 12, microoptics 14, an entrance window 32 into an encapsulation 33, in which optical system 10 is situated, and an exit window 34, printing form 29 being configured subsequently thereto. Here, optical system 10 includes a deflecting element 22, a concave mirror 24, a wavefront-correction element or beam-forming element 30, a so-called beam-profile filter, preferably for transmitting the fundamental mode of light source 12, for example having a Gaussian beam profile, and a concave mirror 26. Optical system 10 is, thus, likewise that of a convex mirror and a concave mirror having conjugate regions, virtual intermediate image 18 being generated from divergent light 16 from light source 12 using microoptics 14 in the first conjugate region, and image point 28 in printing form plane 29 in the second conjugate region. By folding the optical path, as shown, using deflecting element 22, whether it be, as shown here in FIG. 2, passing in front of convex mirror 26, crossing optical path between convex mirror 26 and concave mirror 24, or alternatively thereto, passing behind the convex mirror, it is possible to achieve an even more compact design.

Figure 3:
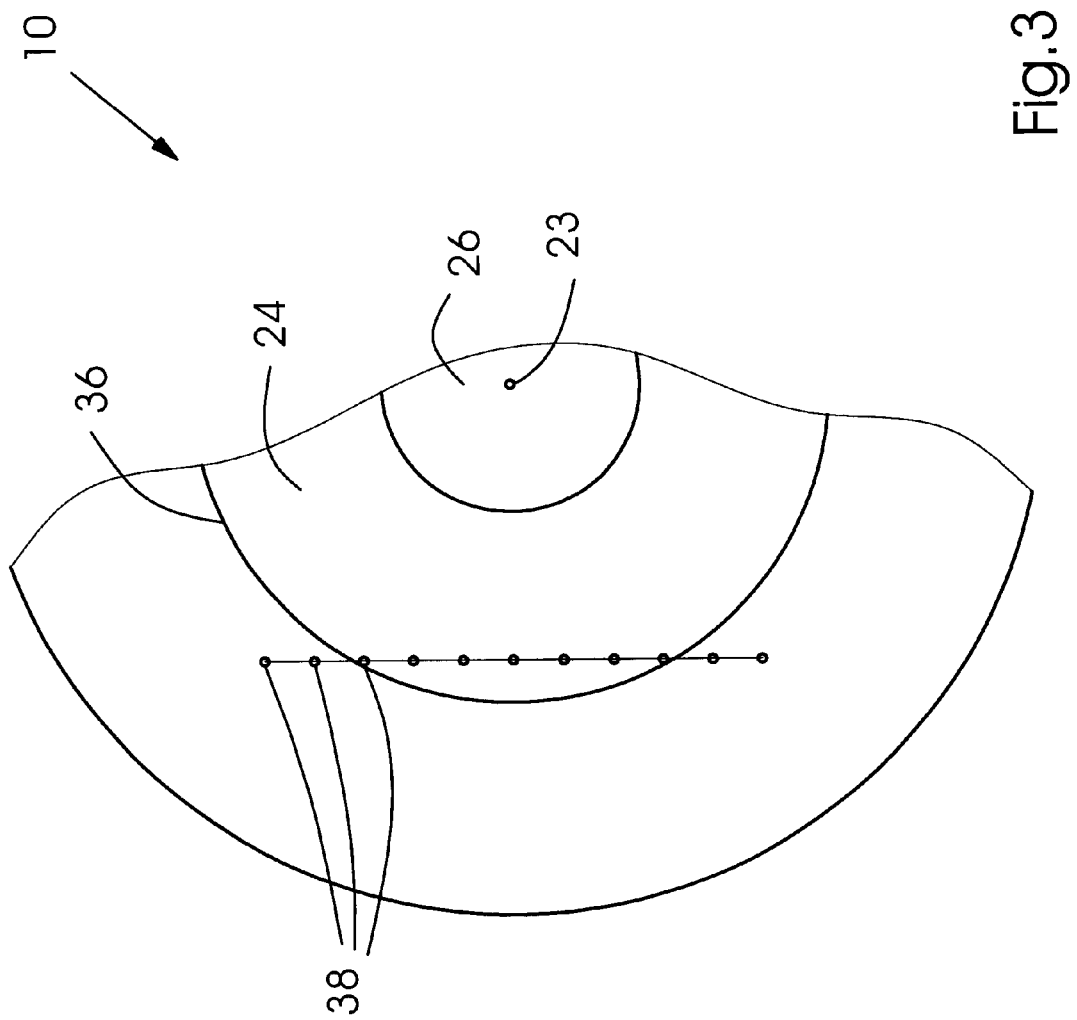
FIG. 3 a schematic representation illustrating the position of the focal line of the optical system of the convex mirror and concave mirror with respect to the row of virtual image points of the array of light sources.

In a schematic representation, FIG. 3 elucidates the position of a focal line, i.e., selected points in a first conjugate region of the optical system of a convex and concave mirror with respect to the row of the virtual image points of the array of light sources. FIG. 3 shows a projection along optical axis 23 of concave mirror 24 and of convex mirror 26 of optical system 10. The essentially circular focal line 36 represents the projection of the conjugate regions on concave mirror 24 for the case of a symmetrical path of rays selected here exemplarily. In other words: the object point and the image point of the optical system of a convex mirror and of a concave mirror lie essentially in phase opposition on a circular focal line 36, thus 180 degrees out of phase about optical axis 23. Focal line 36 essentially describes those points having an optimal advantageous transformation property, thus having minimal aberrations. The aim, at this point, is to approximate the row of virtual image points 38 of this focal line 36. In so doing, it is unimportant in the context of the present invention which precise metrics or measure is selected to measure the distance of line 38 to circular segment 36. As a measure, one may utilize, for example, the average distance of the light sources in projection 38 to optical axis 23, thus the sum of the distances divided by the number of light sources. To achieve an advantageously aberration-minimized imaging through optical system 10, the distance of the projection of the row of virtual image points 38 to the radius of focal line 36 is kept small or is adapted.

In addition, it is clear that optical system 10 of a convex and a concave mirror should be designed such that the projection of focal line 36 exhibits a largest possible radius of curvature. In other words: considered locally, thus considered in the projection of light sources 38, on the scale of the light sources' image point distances which are maximally distant from one another, focal line 36 should have a flattest possible curve shape in comparison to the projection of the row of light sources 38. Thus, the employed optical system 10 only needs to have at least one circular segment of a rotationally symmetric optics of a convex mirror and of a concave mirror.

Figure 4:
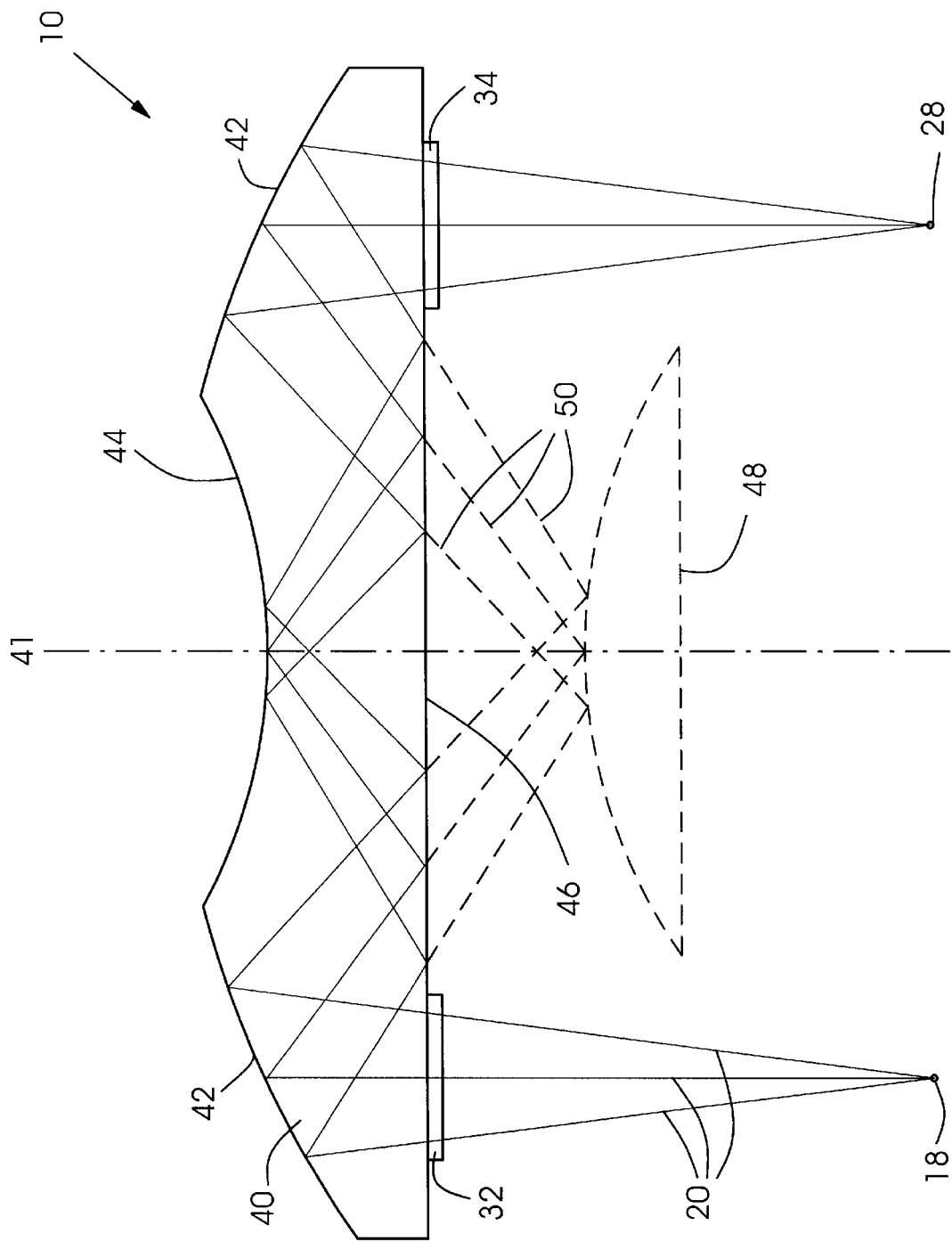
FIG. 4 a schematic representation of a monolithically constructed optical system of a convex mirror and a concave mirror.

FIG. 4 is a schematic representation of a monolithically designed specific embodiment of the optical system in the image-recording device according to the present invention. A monolithic design is employed to further reduce the size of the optical system of a convex and a concave mirror. Such a monolithic design is exemplified in FIG. 4 by a symmetric path of rays. Optical system 10 is symmetrical to axis 41. Emanating from virtual intermediate image 18 of the light source (not shown here), together with microoptics, light beams 20 pass through an entrance window 32 into a monolith 40, which is made exemplarily of a highly refractive glass or of a polymer that is transparent to the employed wavelength. The monolith has a concave surface 42, which reflects light beams 20, so that they impinge on an essentially plane reflecting surface 46 facing opposite concave surface 42. From reflecting surface 46, the beams are thrown at a convex surface 44, emanating from there, symmetrically on the other side of axis of symmetry 41, in turn, reflecting surface 46 and, subsequently, concave surface 42, are hit by the light beams, until they exit the monolith through an exit window 34 and converge in an image point 28, appropriately in the printing-form plane (not shown here). The monolithic design, as shown in this FIG. 4, utilizes the fact that, in an optical system of a convex and a concave mirror, it is above all those regions of the concave mirror, which are distant from the optical axis or axis of symmetry 41, that are used for reflecting light beams from the first conjugate region to the convex mirror, and from the convex mirror into the second conjugate region. This makes it possible to introduce a reflecting surface 46, so that concave surface 42 in the vicinity of the optical axis or axis of symmetry 41, may be replaced by a convex surface 44. The position and the curvature are, of course, determined by the conditions of an optical system of a convex mirror and a concave mirror. Convex surface 44 corresponds to a convex mirror at position 48, upon which light beams 20 would impinge along optical paths 50, if there were no reflecting surface 46. While the sides of monolith 40, off of which light beams 20 are to be reflected, are made as reflective as possible by suitable coatings, whether by a metal coating or interference filters, an antireflection coating, for example an interference filter, is provided for entrance window 32 and/or for exit window 34, to achieve a strongest possible coupling of the light into and out of the monolith.

Figure 5:
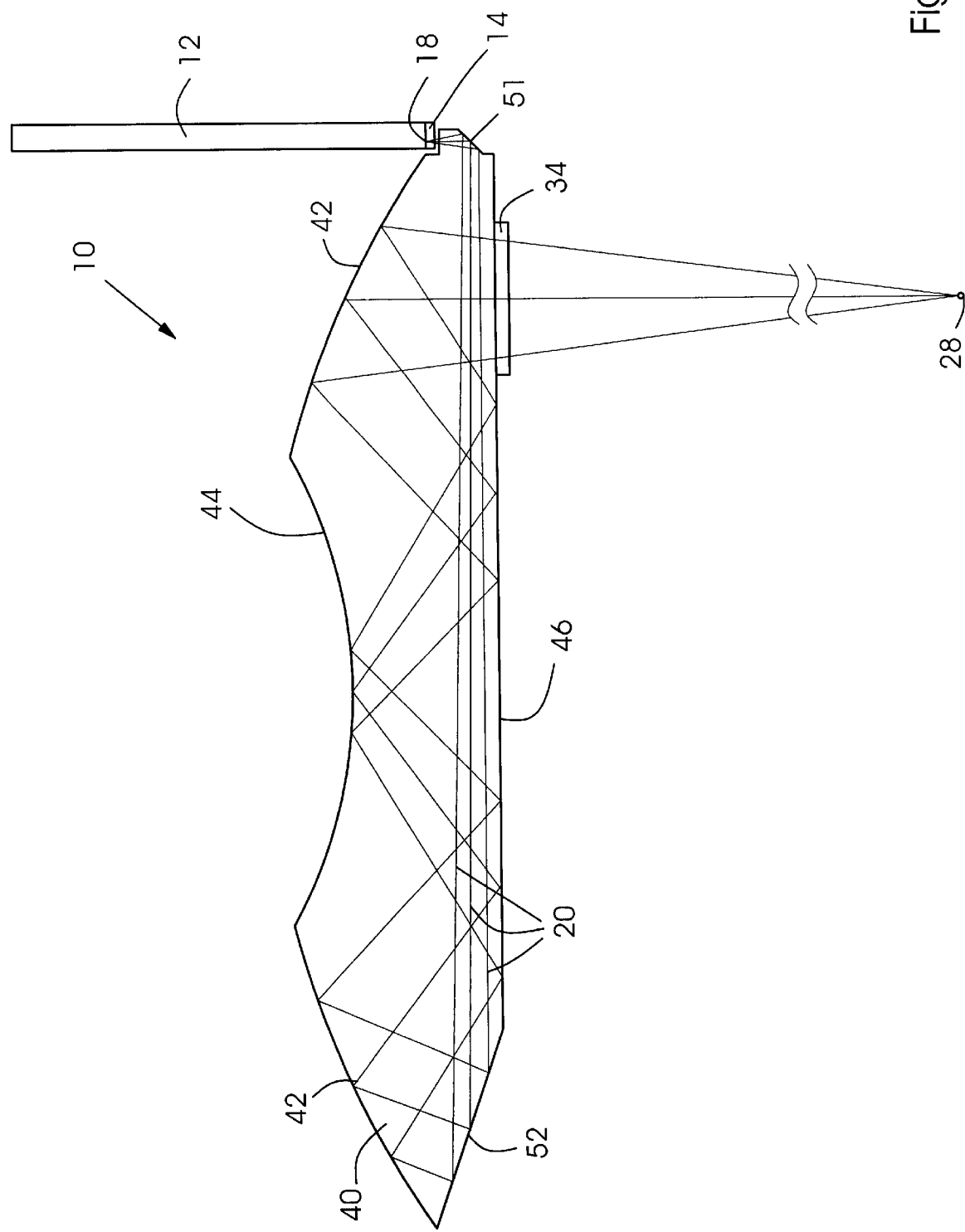
FIG. 5 a schematic representation of a monolithically designed, alternative optical system of a convex mirror and a concave mirror, utilizing two path folds.

FIG. 5 schematically depicts a monolithically designed, alternative optical system of a convex mirror and a concave mirror, utilizing two path folds. A light source 12 is transformed by microoptics 14 into a virtual intermediate image 18. Light beams 20 emanating from this virtual intermediate image 18 enter into monolith 40 and are projected at a first deflecting surface 51 onto a concave surface 42. Light beams 20 then impinge on a reflecting surface 46, on a convex surface 44, once more on reflecting surface 46 and on concave surface 42, to then leave monolith 40 through an exit window 34 and converge in an image point 28.

Figure 6:
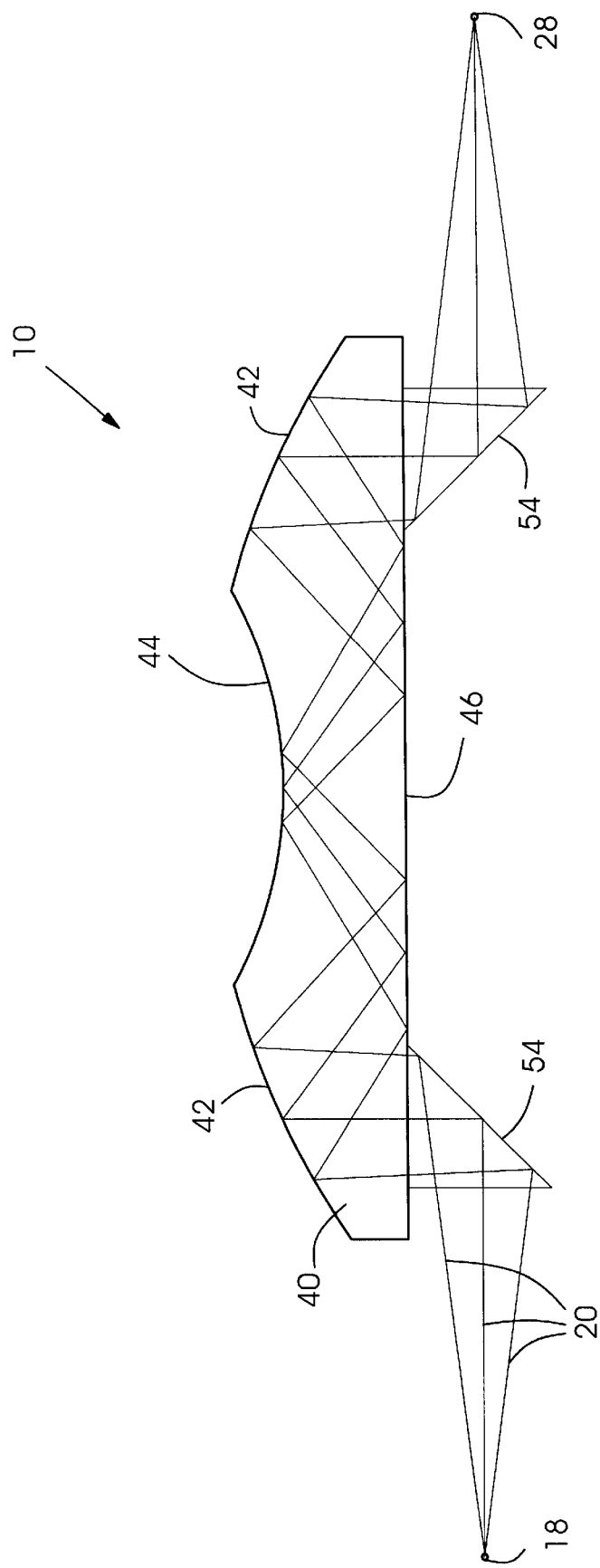
FIG. 6 a schematic representation of a symmetric, monolithically designed, alternative optical system of a convex mirror and a concave mirror, including additional path-folding elements in the form of prisms.

A symmetrically designed alternative optical imaging of a convex mirror and of a concave mirror is schematically shown in FIG. 6, deflecting elements being additionally used in prismatic form. Light beams 20, emanating from virtual intermediate image 18 from light source 12 (not shown here), enter into a prismatic deflecting element 54, off of whose base they are reflected, to then attain monolith 40. A symmetrical optical path is provided. Light beams 20 first impinge upon a concave surface 42, a reflecting surface 46, a convex surface, and once again on reflecting surface 46 and on concave surface 42. Likewise provided subsequently thereto is a prismatic deflecting element 54, off of whose base, light beams 20 are totally internally reflected. The light converges in an image point 28.

FIG. 7 is a schematic representation of another monolithically designed, alternative optical system of a convex mirror and a concave mirror, including an additional convex sphere and a prism for coupling in the light to be imaged. Light 20 from a virtual intermediate image 18 of a light source (not shown here), together with microoptics, enters into a prism 58 and, from there, into a convex sphere 56. In its surface, a region is provided, through which light beams 20 are able to enter, in the most reflection-free possible manner, into monolith 40. Light beams 20 are reflected off of the numerous internal surfaces of the monolith. These internal surfaces include facet 60, a concave surface 42, a reflecting surface 46, and a convex surface 44. The optical path of light 20 is indicated up to image point 28. The light is able to leave monolith 40 through an exit window 34. Typically, convex surface 44 is reflecting, so that light is reflected inside monolith 40.

The device for recording images in accordance with the present invention may provide images at a form cylinder in a print unit. A cylinder of this kind may constitute part of a printing press, for example as a substitute for the form cylinder in a print unit of the printing press in U.S. Pat. No. 6,318,264, which is hereby incorporated by reference herein.

| Reference Numeral List | |
|---|---|
| 10 | optical system |
| 12 | light source |
| 14 | micro-optics |
| 16 | divergent light |
| 18 | virtual intermediate image |
| 20 | light beam |
| 22 | deflecting element |
| 23 | optical axis |
| 24 | concave mirror |
| 25 | center of curvature |
| 26 | convex mirror |
| 27 | conjugate point without deflecting element |
| 28 | image point |
| 29 | printing-form plane |
| 30 | beam-forming element |
| 32 | entrance window |
| 33 | encapsulation |
| 34 | exit window |
| 36 | projection of the focal line |
| 38 | projection of the light sources |
| 40 | monolith |
| 41 | axis of symmetry |
| 42 | concave surface |
| 44 | convex surface |
| 46 | reflecting surface |
| 48 | position of the convex mirror |
| 50 | light beams without reflecting surface |
| 51 | first deflecting surface |
| 54 | prismatic deflecting element |
| 56 | convex sphere |
| 58 | prism |
| 60 | facet |

What is claimed is:

1. An image-recording device for a printing form comprising:
   an array of light sources;
   a microoptics downstream from the array of light sources generating a virtual intermediate image of the light sources, and
   an optical system arranged downstream from the microoptics, the optical system including at least one section of a convex mirror and at least one section of a concave mirror having a common center of curvature and producing a real image.

2. The image-recording device as recited in claim 1, wherein the virtual intermediate image is a magnified imaging of the light sources.

3. The image-recording device as recited in claim 1, wherein the microoptics is aspherical so as to adapt for divergence of the emitted light from the light sources.

4. The image-recording device as recited in claim 1, wherein the optical system has at least one circular segment of rotationally symmetric optics having an assigned object circle, a straight-line projection of a row of the virtual, intermediate image points exhibiting a spacing that is minimized.

5. The image-recording device as recited in claim 1, wherein the optical system includes at least one of (i) at least one light-deflecting element up stream or downstream from reflective surfaces of the convex mirror and of the concave mirror, and (ii) a beam-forming element between the reflective surfaces of the convex mirror and of the concave mirror.

6. The image-recording device as recited in claim 1, wherein the optical system includes a monolith including the at least one section of the convex mirror and the at least one section of the concave mirror.

7. The image-recording device as recited in claim 6, wherein the monolith has active, internal reflecting surfaces.

8. The image-recording device as recited in claim 6, wherein the monolith has at least one entrance window and one exit window provided with antireflection coatings.

9. The image-recording device as recited in claim 6, wherein the optical system further includes optical elements for at least one of beam deflecting, beam forming and wavefront correction assigned to the monolith.

10. The image-recording device as recited in claim 6, wherein the monolith includes glass having a high refractive index in comparison to an ambient environment of the monolith.

11. A printing-form exposure unit comprising:

at least one image-recording device in accordance with claim 1.

12. A print unit comprising:

at least one image-recording device in accordance with claim 1.

13. A printing press comprising:

a feeder, at least one a print unit in accordance with claim 12, and a delivery unit.

* * * * *